United States Patent [19]
Parker et al.

[11] Patent Number: 6,077,629
[45] Date of Patent: Jun. 20, 2000

[54] COMPOSITE HOLOGRAPHIC MEDIA AND PRODUCTION THEREOF

[75] Inventors: William P. Parker, Waitsfield; Scott W. Tighe, Middlesex, both of Vt.

[73] Assignee: Diffraction, LTD, Waitsfield, Vt.

[21] Appl. No.: 09/026,586

[22] Filed: Feb. 20, 1998

[51] Int. Cl.[7] ................................................... G03F 7/027
[52] U.S. Cl. ........................ 430/1; 430/2; 430/290; 359/3; 359/35
[58] Field of Search ............................... 430/290, 1, 2; 359/1, 3, 35

[56] References Cited

U.S. PATENT DOCUMENTS

| | | | |
|---|---|---|---|
| 3,829,193 | 8/1974 | Tsunoda et al. | 359/29 |
| 4,187,111 | 2/1980 | Chandross et al. | 430/2 |
| 4,842,968 | 6/1989 | Kojima et al. | 430/1 |
| 5,196,282 | 3/1993 | Knobbe | 430/2 |
| 5,328,975 | 7/1994 | Hanson et al. | 528/29 |

FOREIGN PATENT DOCUMENTS

| | | |
|---|---|---|
| 6-19040 | 1/1994 | Japan . |
| 6-148880 | 5/1994 | Japan . |

OTHER PUBLICATIONS

Glebov, L.B., et al., "photorefraction in porous xerogel–photopolymer composite materials" Sov. Tech. Phys. Lett. 16(6) pp 445–446, Jun. 1990.

Kuchinskii, S.A., et al., "Principles of hologram formation in capillary composites" Opt. Spectrosc. 72(3) pp 383–391, Feb. 1991.

*Primary Examiner*—Martin Angebranndt
*Attorney, Agent, or Firm*—Thomas N. Neiman

[57] ABSTRACT

The present invention is directed to a holographic media that is composed of a mixture of a photosensitive substance such as a photopolymer and a porous rigid material such as an aerogel that provides a substructure to the composite material. This unique composition of matter can be utilized in a multitude of applications where a thick optically patterned wavefront modulating media is required, including as a holographic storage device. The composite material avoids the difficulties regarding shrinkage found in plain photopolymers. The rigid highly porous component is specially treated to receive the photosensitive material. This unshrinkable substructure has a plurality of very small, rigid pores that is essentially transparent at optical wavelengths and provides the matrix for the photopolymers. It provides holographic recording in both thin and thick formats without shrinkage and pattern distortion. The method of producing the composite holographic media is also disclosed.

16 Claims, 6 Drawing Sheets

COMPOSITE HOLOGRAPHIC MEDIA AND PRODUCTION THEREOF

BACKGROUND OF THE INVENTION

This invention pertains to a composition of matter that is photosensitive, and in particular, to a material that is able to preserve a spatial modulation in three dimensions when exposed to a spatially varying illumination. The unique composition is designed to allow the use of a mixture of photopolymer, or other photoreactive material, and a microscopically porous rigid transparent structure, such as an aerogel, to form a holographic media of variable thickness which eliminates shrinkage or other shape distortions found in photopolymer based devices. A method of producing a holographic data storage apparatus utilizing this material is also disclosed.

A large number of materials and devices are currently used to record holographic images or interference patterns. In a holographic recording process, an object beam is mixed with a reference beam from the same laser. The summation of the two fields gives rise to a unique spatially varying amplitude pattern. This pattern, when recorded by an amplitude sensitive medium, is the hologram. The hologram may preserve both amplitude and phase information presented in the mixture of the two beams. A three dimensional image may be preserved and reconstructed by the illumination of the hologram with the conjugate of the reference beam. In addition to the storage of imagery, data may be placed in the object beam by means of a spatial pattern of dark and light areas. This data is then recorded as a page in the holographic media and may be later read by the application of the reference beam or its conjugate to the same location and at the same angle as the original object beam. If shrinkage occurs during the original or subsequent recordings, the readout of the desired page may be erroneous, nonexistent or directed to the incorrect location for readout. Current media show limitations in the allowable thickness of a holographic exposure to small fractions of millimeter, whereas the more significant advantages of three dimensional data storage are to be found in bulk materials with thicknesses in excess of several millimeters. In other applications, a holographic media's natural shrinkage must be compensated for at the time of exposure, such as in the production of holographic notch filters made via interferometric exposure.

Photopolymers have been used extensively as holographic recording materials. They are generally composed of a mixture of polymer molecules, monomers and photoactive substance that catalyze polymerization of the monomers in response to illumination. They have been used as stand alone materials of relatively thin designs, primarily as films or coatings on a rigid or flexible substrate. Thick designs have not been successfully used because of internal structural changes and subsequent image loss or data distortion caused by microscopic shape distortions and bulk shrinkage of the polymer component. What has not been done in this area is a photoactive material that can be used in varying thickness without distortion as a holographic recording media for numerous applications in optics and photonics.

Another, completely unrelated, class of materials are low density microscopically porous glasses where the internal structures are rigid but composed of nanometer scale structures. This class includes porous glasses, aerogels and nanostructured materials. Porous glasses, made by selective chemical leaching of silica glasses, have been used as structural supporting elements in other experimental composite holographic media, but have relatively low porosity, generally less than 50% and usually less than 20%, whereas aerogels are the least dense man-made substances, with porosities greater than 80%. Aerogels, sometimes referred to as "solid smoke" have been used as thermal insulating materials; as porous electrodes in electrical storage devices; in devices for collecting cosmic dust; as electromagnetic radiation absorbers for stealth type applications; as a catalyst support surfaces; in ion exchange matrices; for fuel cell diffusion barriers and in gas and liquid filtration. One reference that details the history and applications of aerogels is "Aerogels" by Dr. Jochen Fricke, published by Springer-Verlag, Berlin, in 1986 ISBN 3-540-16256-9. Methods of fabricating aerogels have been described in the U.S. Pat. No. 3,672,833, issued to S. J. Teichner, for a "Method of Preparing Inorganic Aerogels", which issued on Jun. 27, 1972 and the Patent issued to Yokogawa et al, U.S. Pat. No. 5,496,527 for a "Process for Forming A Hydrophobic Aerogel", which issued on Mar. 5, 1996.

It is the combination of these two previously unrelated classes of materials, photopolymers and aerogels, that is the subject of this invention. The photosensitivity of a photopolymer type material is coupled with the inherent rigidity and porosity of an aerogel type material to form a new composition of matter that is a nanostructured holographic media with unique properties and utility.

Applications of the composite holographic media and numerous and broad in their scope. Beside the uses indicated in the previous descriptions herein for hologram image recording and holographic data recording, it is clear that all classes of holographic optical elements (HOE's) and diffractive optical elements (DOE's) will be possible with the present invention. Thick media that is stable is an advantage in these fields as it is in the production of holographic gratings, diffraction gratings and wavelength selective filters of all types. Narrow bandwidth filters such as notch filters and filters usable for dense wavelength division multiplexing (DWDM) fiber optic or free space optical communications systems are of significant commercial value.

The composition of matter that is the subject of the present invention may be composed from numerous types of photosensitive compounds or mixtures in combination with any of a variety of porous structures and still fall within the scope of the invention. Mechanisms of recording in the resulting composite can be the result of any type of physical phenomena, regardless of a capacity to shrink but benefiting from having a potentially thick and rigid, or semi-rigid, internal structure. In the case of most photopolymers the physical mechanism that produces the spatial modulation that is the hologram is the light initiated polyerization of unbound monomers. It is the illumination generated spatially varying polymerization and subsequent diffusion of unpolymerized monomers that causes both the desired variation in index of refraction and the unwanted shrinkage. Other mechanisms of causing illumination generated spatial modulation may result in variations in birefringence or polarization rotation, optical absorption or wavelength specific optical absorption, and reflectivity.

Clearly, it is desirable for a material of this type to be very adaptable. At the same time, the material should be easy to manufacture and be produced of cost effective precursors. It is the object of this invention to set forth a composite holographic media and a method of producing the same which avoid the disadvantages and previously mentioned limitations of typical current media.

SUMMARY OF THE INVENTION

Particularly, it is the object of this invention to teach a photoactive or photosensitive material, for use in providing a hologram recording media of various thickness that overcomes the problems inherent in photopolymers, said structure comprises a mixture of first means and said second means, said first means comprising a photosensitive composition and said second means comprising an aerogel, or other semitransparent low density highly porous composition, used in combination for providing a stable matrix for recording said hologram. Also, it is the object of this invention to teach a holographic data storage apparatus, for use in providing a recording storage media of various thickness that overcomes the problems inherent in photopolymer storage systems, said structure comprising in combination a central core unit for storing the data; said central core unit comprising at least one composite photopolymer and aerogel monolith for providing the storage media for said holographic data storage apparatus; means for sealing said central core unit in position; and means for locking said central core unit and said sealing unit in position as a single entity.

It is also the object of this invention to teach a method of producing a holographic data storage apparatus, for use in providing a recording storage media of various thickness that overcomes the problems inherent in photopolymer storage systems, said method comprising the steps of providing a photosensitive material in a fluid or gel form for use as a recording media for a holographic data storage apparatus; providing an aerogel for combining the aerogel with the photopolymer into a recording storage mixture; treating the aerogel for making the aerogel receptive for receiving the photopolymer; saturating the treated aerogel with the photopolymer; positioning the aerogel in a transparent sealing unit for creating the central core unit that provides the recording storage capacity for the holographic data storage apparatus; sealing the central core unit; and locking the central core unit and seal in position creating a single entity.

BRIEF DESCRIPTION OF THE INVENTION

Further objects and features of this invention will become more apparent by reference to the following description taken in conjunction with the following figures, in which.

DESCRIPTION OF THE PREFERRED EMBODIMENTS

Figure 1:
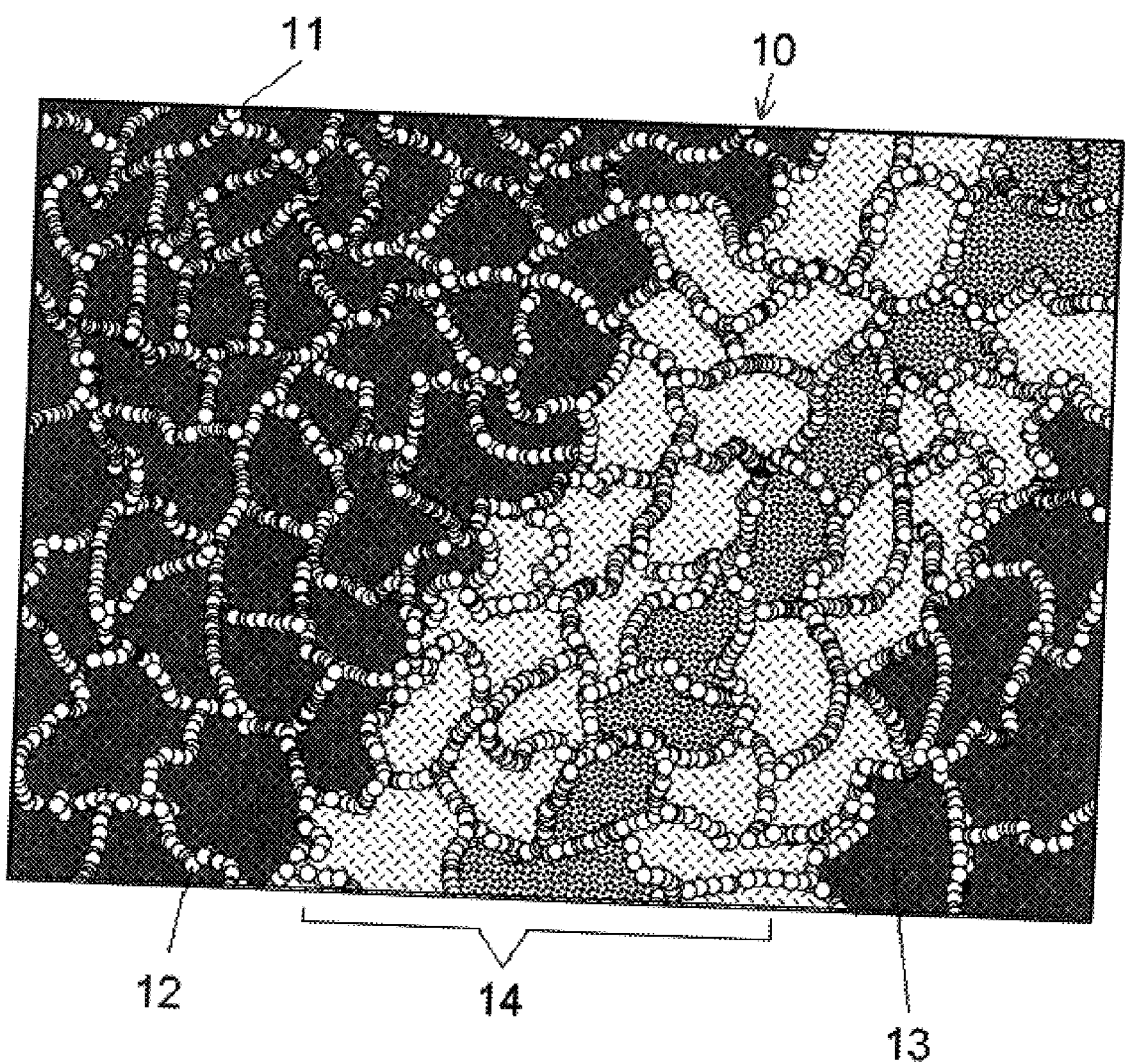
FIG. 1 is a rendering of the microscopic structure of the composite holographic media.

As shown in the figures, the novel composite holographic media 10 comprises a first solid phase substructure 11 having a backbone composed of nanometer sized silica beads 12 and a second solid, liquid or gel phase of photosensitive compound 13 which together act as the composite holographic media. Spatial modulation of the photosensitive compound is indicated in the localized area 14 equivalent to a single period of a diffraction grating or one fringe of a hologram.

Figure 2:
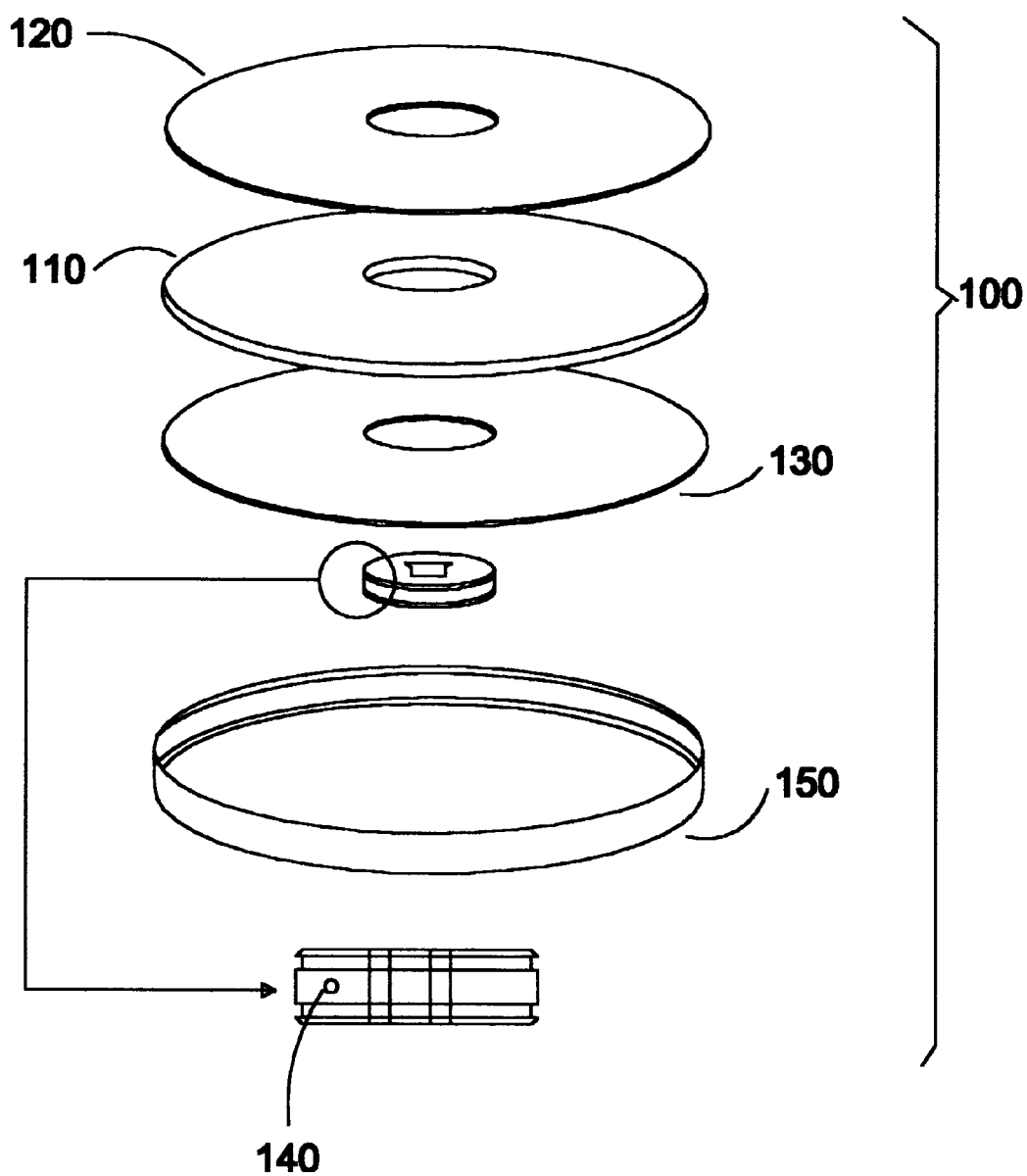
FIGS. 2 and 3 are exploded perspective views of the holographic data storage apparatus.
Figure 3:
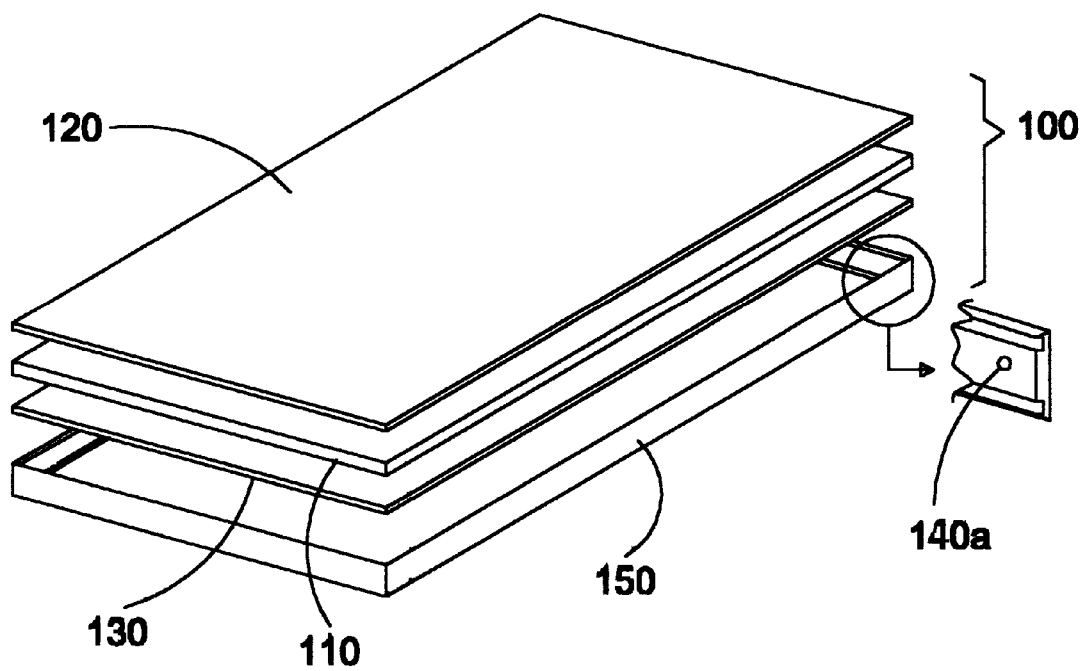

The novel holographic data storage apparatus 100 as shown in FIG. 2 and FIG. 3 comprises a central core unit 110 having a mixture of the aforementioned photosensitive compounds and microscopically porous rigid or semi-rigid transparent or semi-transparent structures which in combination act as the holographic data storage media. The central core unit 110 has a top and bottom seal 120 and 130 and are constructed of a transparent material such as glass or plastic. The seals have an aperture 140 and 140a that allows the solvents to escape over time if required. A retaining device 150 is designed to hold the central core unit 110 and the seals 120 and 130 in position to form a single entity. The holographic data storage apparatus can be produced in many geometric formats including but not limited to a disc, cylinder or rectangular chip format.

The composite material of the central core unit is a combination of a rigid or semi-rigid microscopically porous structure or nanostructure, such as a silica aerogel monolith, that is treated to receive or combine with a photosensitive composition, such as a photopolymer, to form the central core unit. The silica aerogel monoliths can be produced from a large group of chemicals, such as, tetraethylorthosilicate, tetramethylorthosilicate, melamine, formaldehyde, resorcinol, organophospate and organoaluminophospates. The monoliths have the characteristics of having small pores, are rigid or semi-rigid and transparent at selected wavelengths after processing from a sol-gel format. Once a sol-gel is formed, the synthesis of the aerogel can be done using a molding technique. It may be near-net shaped in the sol-gel format or shaped after completion of the synthesis using cutting tools. The molded sol-gel forms are then dried using supercritical drying techniques. Silanization using a silane based agent such as chlorotrimethylsilane or hexamethyldisilazane gives the aerogel hydrophobic properties for use with photopolymers such as dichromated polyacrylic acid and dichromated gelatin.

The aerogel form enters a liquid phase saturation using photopolymers in a liquid or gel form. A modified dichromated polyacylic acid or a dichromated gelatin can be used. This is accomplished in a dark box which is sealed to prevent evaporation of the solvent system and is allowed to be saturated over a period of time. For use as a disc, slab plate or other thick planar shape, the finished composite product in then positioned into a specially designed seal, either glass or plastic, that is tight fitting, and has an aperture designed to allow evaporation of the solvent over time. The entire entity is then locked into position using the retaining device.

Figure 4:
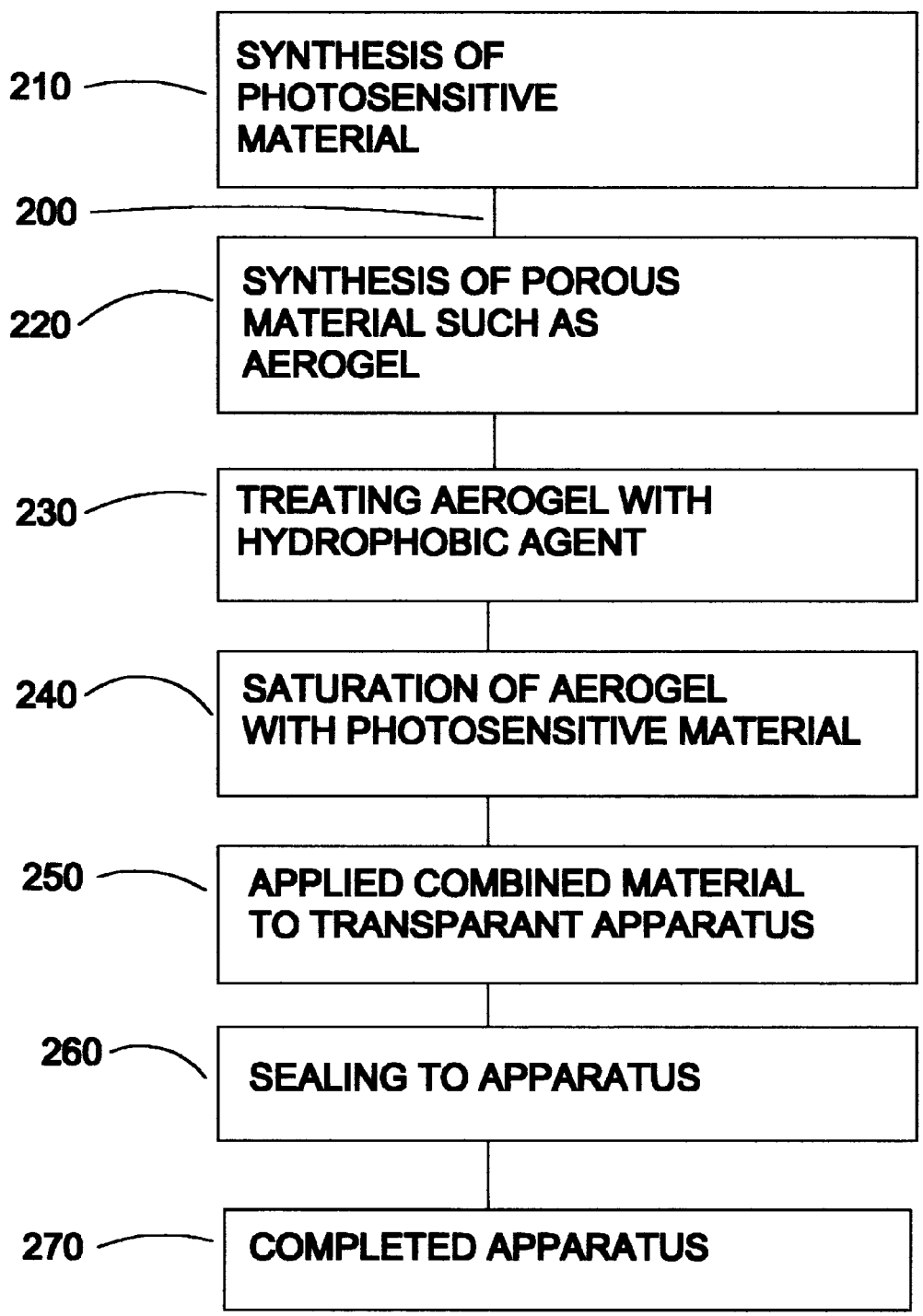
FIG. 4 is a block diagram of the novel method of producing a holographic data storage apparatus.
Figure 5:
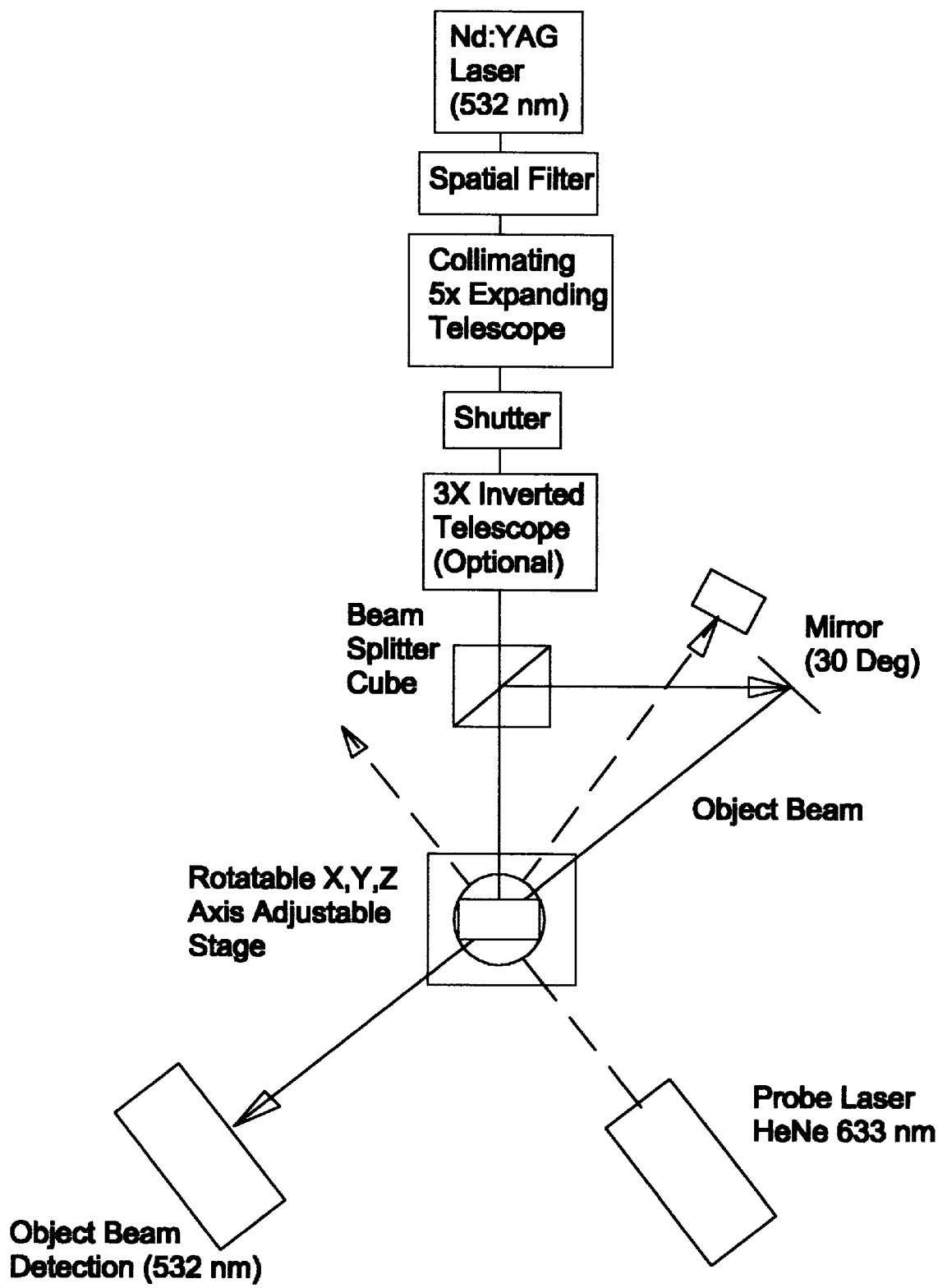
FIG. 5 is a block diagram of the method of testing the holographic data storage apparatus.

The novel method 200 of producing a holographic data storage apparatus is shown schematically in FIG. 4 and comprises the following steps: providing a photopolymer in a liquid or gel form for use as a recording media for the holographic data storage apparatus 210; providing an aerogel for combining the aerogel with photopolymer into a recording storage mixture 220; treating the aerogel for making the aerogel receptive for receiving the photopolymer 230; saturating the treated aerogel with the photopolymer for creating the central core unit that provides the recording storage capacity for the holographic data storage apparatus 240; positioning the aerogel in a transparent sealing unit 250; sealing the central core unit 260; and locking the central core unit and seals in position creating a single entity 270.

Figure 6:
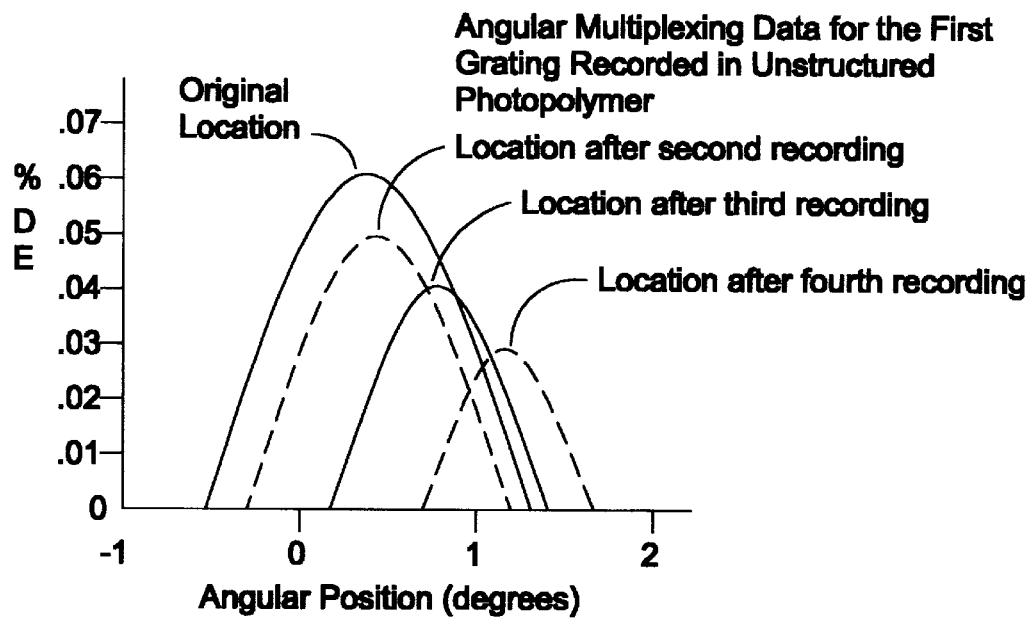
FIGS. 6 and 7 are graphs of data taken from experiments designed to measure the amount of shrinkage of gratings produced in the composite material.
Figure 7:
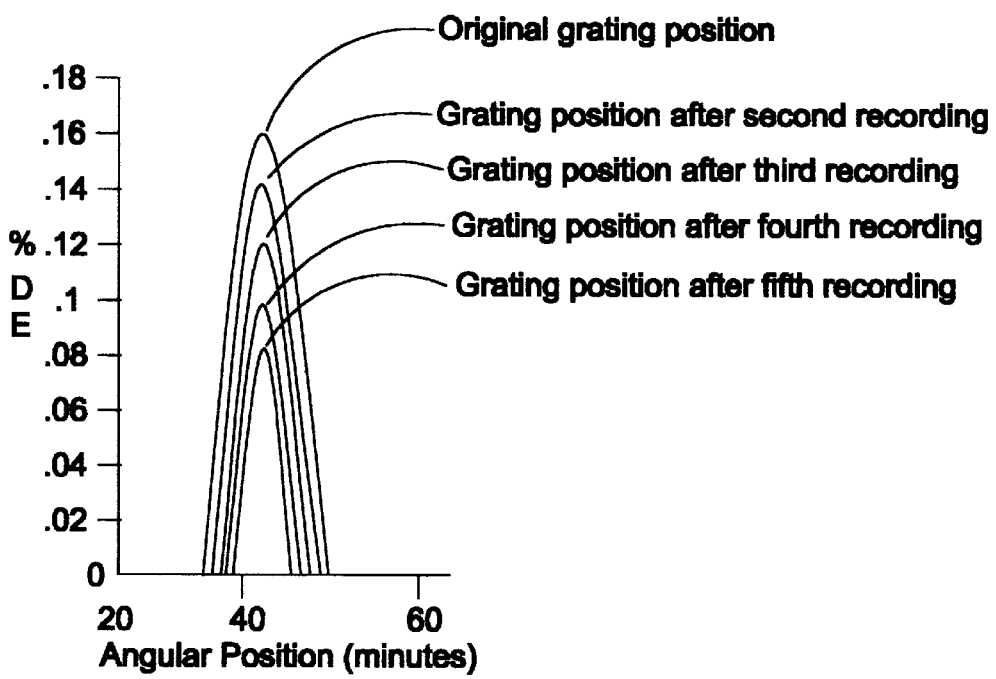

The apparatus is constructed and designed for a unique purpose. The thickness of the apparatus controls the amount of capacity of the unit. A two millimeter thick disc version would be able to hold a minimum of 50 gigabytes of storage capacity. A 50 millimeter by 65 millimeter chip format having a two and a half millimeter thickness would have the capacity of one hundred and fifty gigabytes. Testing of the novel central core unit was done to ensure the effectiveness of the method of producing the apparatus and is shown in FIG. 3. The laser beam was passed through a spatial filter, collimating expanding telescope, shutter and if necessary a reducing telescope. After passing through a beam splitter cube, the object beam was set at a thirty degree internal angle from the reference beam. The reference beam was normal to the test sample in order to examine the effects of anomalous features which might not be observed if recording were done with an angle set between the reference and object beam. FIG. 6 shows a graph of the results of an unstructured photopolymer when recorded with the laser at various exposure times. Multiplexing data was also collected for the unstructured photopolymer by exposing at different angle intervals at the same location. This was then compared with recording the properties of the finished product shown in FIG. 7. The lack of shrinkage generated shifting is obvious in the graph.

While we have described our invention in connection with specific embodiments thereof, it is clearly to be understood that this is done only by way of example and not as a limitation to the scope of our invention as set forth in the objects thereof and in the appended claims.

We claim:

1. A holographic data storage apparatus, for use in providing a recording storage media of various thickness that overcomes the problems inherent in photopolymer storage systems, said structure comprising:

a central core unit for storing the data;

said central core unit comprising a mixture of first means and said second means, said first means comprising photopolymers and said second means comprising aerogels for providing a stable platform for holding said data;

sealing means for restricting said central core unit within a predetermined area comprising a container; and locking means for maintaining said sealing means and said central core unit in a single entity.

2. A holographic data storage apparatus, according to claim 1, wherein:

said photopolymers of said first means comprise modified dichromated polyacrylic acid.

3. A holographic data storage apparatus, according to claim 1, wherein:

said photopolymers of said first means comprise modified dichromated gelatins.

4. A holographic data storage apparatus, according to claim 1, wherein:

said aerogels of said second means comprise silica aerogel monoliths.

5. A holographic data storage apparatus, according to claim 4, wherein:

said silica aerogel monoliths comprise elements constructed of ethyl silicate.

6. A holographic data storage apparatus, according to claim 4, wherein:

said silica aerogel monoliths comprise elements constructed of methyl silicate.

7. A holographic data storage apparatus, according to claim 1, wherein:

said sealing means for said central core unit comprises said container having said locking means for attaching said central core to said to said sealing means;

said sealing means for said central core unit further comprises transparent seals positioned above and below said central core unit; and said transparent seals having at least one ventilation aperture positioned therein for allowing the release of solvents over a period of time.

8. A holographic data storage apparatus, according to claim 1, wherein:

said locking means for said holographic data storage apparatus comprises a device for enclosing the perimeter of said central core unit and said sealing means in adjacent, predetermined position with respect to each other.

9. A holographic data storage apparatus, for use in providing a recording storage media of various thickness that overcomes the problems inherent in photopolymer storage systems, said structure comprising in combination:

a central core unit for storing the data;

said central core unit comprising a plurality of photopolymers and aerogel monoliths for providing the storage media for said holographic data storage apparatus;

means for sealing said central core unit in position comprising a container; and means for locking said central core unit and said sealing unit in position as a single entity.

10. A method of producing a holographic data storage apparatus, for use in providing a recording storage media of various thickness that over comes the problems inherent in photopolymer storage systems, said method comprising the steps of:

providing a photopolymer in a fluid or gel form for use as a recording media for the holographic data storage apparatus;

providing an aerogel for combining the aerogel with the photopolymer into a recording storage mixture;

positioning the aerogel in a transparent sealing unit;

treating the aerogel for making the aerogel receptive for receiving the photopolymer;

saturating the treated aerogel with the photopolymer for creating the central core unit that provides the recording storage capacity for the holographic data recording apparatus;

sealing the central core unit within a container; and locking the central core unit and seals in position creating a single entity.

11. A method of producing a holographic data storage apparatus, according to claim 10, wherein:

said providing a photopolymer in a liquid or gel form step comprise the step of using an element from a class of photoreactive compounds that are to be combined with the aerogels.

12. A method of producing a holographic data storage apparatus, according to claim 10, wherein:

said providing a aerogel step comprises the steps of using an element from a class of compounds that can be formed into silica aerogel monoliths.

13. A method of producing a holographic data storage apparatus, according to claim 10, wherein:

said treating the aerogel step comprises the step of silanizating the aerogel for permitting the aerogel to acquire hydrophobic properties; and said treating the aerogel step further comprises the step of aerating the silanized aerogel.

14. A method of producing a holographic data storage apparatus, according to claim 10, wherein:

said saturating the treated aerogel step comprises the step of immersing the treated aerogel with the liquid or gel form of the photopolymer in a darkened, sealed enclosure for a predetermined period of time.

15. A method of producing a holographic data storage apparatus, according to claim 10, wherein:

said sealing the central core unit step comprises the step of positioning the central core unit in transparent seals adjacent to the transparent seals; and said sealing the central core step further comprises the step of providing at least one ventilation aperture in the seals for allowing the release of solvent over a period of time.

16. A method of producing a holographic data storage apparatus, according to claim 10, wherein:

said locking the central core step comprises the step of providing a perimeter device that encompasses the central core unit and the transparent seals holding them in position forming a single entity.

* * * * *